(12) United States Patent
Jen (10) Patent No.: US 8,809,890 B2
(45) Date of Patent: Aug. 19, 2014

(54) REFLECTIVE PHASE RETARDER AND SEMICONDUCTOR LIGHT-EMITTING DEVICE INCLUDING SUCH REFLECTING PHASE RETARDER

(71) Applicant: Yi-Jun Jen, Keelung (TW)

(72) Inventor: Yi-Jun Jen, Keelung (TW)

(73) Assignee: National Taipei University of Technology, Taipei (TW)

( * ) Notice: Subject to any disclaimer, the term of this patent is extended or adjusted under 35 U.S.C. 154(b) by 0 days.

(21) Appl. No.: 13/886,634

(22) Filed: May 3, 2013

(65) Prior Publication Data
US 2014/0070251 A1    Mar. 13, 2014

(30) Foreign Application Priority Data
Sep. 13, 2012    (TW) .............................. 101133415 A (51) Int. Cl.
*H01L 33/00*    (2010.01)

(52) U.S. Cl.
USPC ................. 257/98; 257/88; 257/89; 257/100

(58) Field of Classification Search
USPC .............. 257/12–13, 81, 84, 87–89, 98–100, 257/347–348, 433–434; 313/112, 501, 503, 313/506–507
See application file for complete search history.

(56) References Cited

U.S. PATENT DOCUMENTS

2008/0128727 A1*   6/2008   Erchak et al. ................... 257/98

* cited by examiner

*Primary Examiner* — Dung A. Le
(74) *Attorney, Agent, or Firm* — Thomas | Horstemeyer, LLP (57) ABSTRACT

The invention provides a reflective phase retarder and a semiconductor light-emitting device including such reflective phase retarder. The reflective phase retarder of the invention converts an incident light beam with a first type polarization into the light with a second type polarization, and reflects the converted light beam with the second type polarization out.

7 Claims, 7 Drawing Sheets

REFLECTIVE PHASE RETARDER AND SEMICONDUCTOR LIGHT-EMITTING DEVICE INCLUDING SUCH REFLECTING PHASE RETARDER

CROSS-REFERENCE TO RELATED APPLICATION

This utility application claims priority to Taiwan Application Serial Number 101133415, filed Sep. 13, 2012, which is incorporated herein by reference.

BACKGROUND OF THE INVENTION

1. Field of the Invention

This present invention relates to a reflective phase retarder and a semiconductor light-emitting device including such reflective phase retarder.

2. Description of the Prior Art

The wave plate, also named as phase retarder, is used to convert polarization of light beams. Most of prior arts phase retarders are transmissive type which is applicable in optical systems to convert polarization of transmissive light beam.

Reflective phase retarders have been applied in some optical systems, such as micro-projectors, to satisfy need of high contrast ratio for micro-projection by enhancing polarization efficiency of backlight modules in the micro-projectors.

With respect to prior arts of reflective phase retarders, periodically arranged metal protruding strings and grooves to constitute metal diffraction grating are provided, with drawback of being difficult to manufacture. Alternately metal particles are used to constitute a rough surface as a reflective phase retarder, but it is only successful in laboratory since its difficulty to practice.

In addition, semiconductor light-emitting devices using reflective phase retarders have not been devised yet.

SUMMARY OF THE INVENTION

Accordingly, an objective of the invention is to provide an easy-to-made reflective phase retarder.

Furthermore, another objective of the invention is to provide a semiconductor light-emitting device using such reflective phase retarder.

According to the first preferred embodiment of the invention, a reflective phase retarder includes a substrate, a reflective layer and a multi-layer structure. The reflective layer is formed on the substrate. The multi-layer structure is formed on the reflective layer, and is constituted by at least one symmetrical or a pseudo-symmetrical film stack. The symmetrical or a pseudo-symmetrical film stack includes at least one anisotropic dielectric film. Therein, a light beam of a first type polarization, entering from a top surface of the multi-layer structure, is converted by the multi-layer structure into the light beam of a second type polarization, and is reflected by the reflective layer out of the top surface.

According to the second preferred embodiment of the invention, a reflective phase retarder includes a transparent substrate, a multi-layer structure and a reflective layer. The multi-layer structure is formed on a first surface of the substrate, and is constituted by at least a symmetrical or a pseudo-symmetrical film stack. The symmetrical or a pseudo-symmetrical film stack includes at least one anisotropic dielectric film. The reflective layer is formed on the multi-layer structure. Therein, a light beam of a first type polarization, entering from a second surface opposite to the first surface of the transparent substrate, is converted by the multi-layer structure into the light beam of a second type polarization, and is reflected by the reflective layer out of the second surface.

In one embodiment, at least one anisotropic dielectric film is constituted by an array of dielectric nanorods.

According to the third preferred embodiment of the invention, a reflective phase retarder includes a substrate, a reflective layer and an anisotropic dielectric film. The reflective layer is formed on the substrate. The anisotropic dielectric film is formed on the reflective layer, and is constituted by an array of dielectric nanorods. Therein, a light beam of a first type polarization, entering the anisotropic dielectric film, is converted by the anisotropic dielectric film into the light beam of a second type polarization, and is reflected by the reflective layer out of the anisotropic dielectric film.

According to the fourth preferred embodiment of the invention, a reflective phase retarder includes a transparent substrate, an anisotropic dielectric film and a reflective layer. The anisotropic dielectric film is formed on a first surface of the transparent substrate, and is constituted by an array of dielectric nanorods. The reflective layer is formed on the anisotropic dielectric film. Therein, a light beam of a first type polarization, entering a second surface opposite to the first surface of the transparent substrate, is converted by the anisotropic dielectric film into the light beam of a second type polarization, and is reflected by the reflective layer out of the second surface.

A semiconductor light-emitting device, according to a preferred embodiment of the invention, includes a semiconductor multi-layer structure, a polarizing beam splitter and a reflective phase retarder. The semiconductor multi-layer structure includes a light-emitting layer which is capable of being driven by an electric current to emit a first light beam of a first type polarization and a second light beam of a second type polarization. The polarizing beam splitter is formed on a top surface of the semiconductor multi-layer structure, and is for transmitting the first light beam of the first type polarization, and reflecting the second light beam of the second type polarization. The reflective phase retarder is formed on a bottom surface of the semiconductor multi-layer structure. Therein, the reflected the second light of the second type polarization, entering the reflective retarder, is converted into the second light beam of the first type polarization, and is reflected by the reflective phase retarder to pass through the polarizing beam splitter.

In one embodiment, the reflective phase retarder includes a multi-layer structure and a reflective layer. The multi-layer structure is formed on the bottom surface of the semiconductor multi-layer structure, and is constituted by r at least a symmetrical or a pseudo-symmetrical film stack. The symmetrical or a pseudo-symmetrical film stack includes at least one anisotropic dielectric film. The reflective layer is a multi-layer reflective structure.

In one embodiment, the anisotropic dielectric film is constituted by an array of dielectric nanorods.

In one embodiment, the polarization beam splitter is a sub-wavelength metal grating.

In one embodiment, the polarizing beam splitter is a multi-layer structure composed of anisotropic dielectric films.

In one embodiment, the polarization beam splitter is formed by arranging films with high refractive index and films with low refractive index upon a transparent grating.

The further advantage and spirit of the invention may be understood by the following recitations together with the appended drawings.

DETAILED DESCRIPTION OF THE INVENTION

Figure 1:
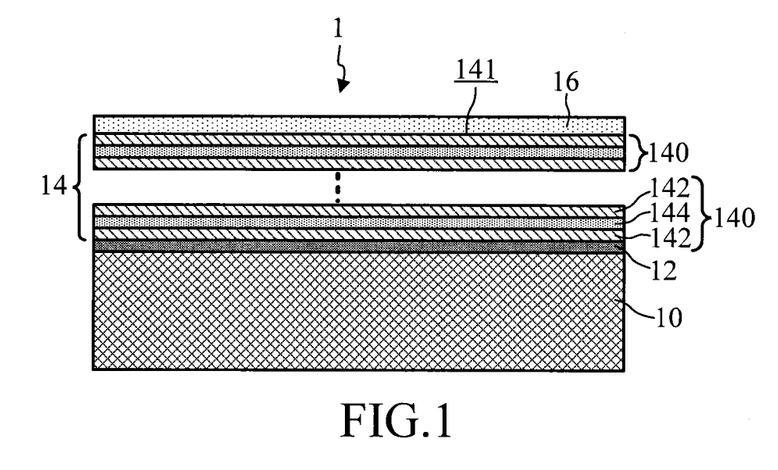
FIG. 1 is a cross sectional view of the reflective phase retarder according to the first preferred embodiment of the invention.

Referring to FIG. 1, FIG. 1 is a cross sectional view of the reflective phase retarder 1 according to the first preferred embodiment of the invention.

As shown in FIG. 1, the reflective phase retarder 1 includes a substrate 10, a reflective layer 12 and a multi-layer structure 14. The reflective layer 12 is formed on the substrate 10. The multi-layer structure 14 is formed on the reflective layer 12. The multi-layer structure 14 is constituted by at least a symmetrical or a pseudo-symmetrical film stack 140. The (pseudo) symmetrical film stack includes odd number of film (s), and the odd number of film(s) include a central film disposed at a midst location, and with respect to the central film, the properties of films at two sides are identical or resembling (similar) to each other. The odd number of film(s) include at least an anisotropic film. Odd number is greater than one.

One embodiment of pseudo-symmetrical film stack is used for explaining the meaning of pseudo-symmetry. The pseudo-symmetrical film stack 103 includes film A'/film B/film A. About the film properties, properties of A' ≈ those of A (similar, akin), or properties of A'=those of A (substantially identical). The corresponding thickness d, d' might be also similar, or even might be substantially identical. The film A or A' is an anisotropic film and the film B is an isotropic film. Or the film A or A' is an isotropic film and the film B is an anisotropic film. As the properties are akin, the relationship is named as pseudo-symmetry in the entire specification.

The symmetrical or a pseudo-symmetrical film stack 140 is the film stack such as ABA, ABCBA, ABCDCBA or other similar pseudo-symmetrical film stack, wherein A, B or C respectively denotes a single film within the stack. The optical property of film stack can be regarded as an equivalent film having refractive index N and phase thickness $\phi$, wherein the physics meaning of phase thickness $\phi$ is the amount of wavelength of the light beam advancing in this equivalent film, or namely variation of light phase. The equivalent refractive index N and phase thickness $\phi$ are functions of wavelength $\lambda$, the refractive index of each constituting film, the incidence angle, and the thickness. As each film stack is repeatedly formed m times, the refractive index of the equivalent film still equals N, and the phase thickness $\phi$ will become m times of original phase thickness $\phi$ (i.e., m $\phi$). In particular, the symmetrical or a pseudo-symmetrical film stack 140 includes at least one anisotropic dielectric film. Taking a film stack of $(ABA)^m$ as an example, either or both of A-film and B-film may be an anisotropic dielectric film. The symmetrical or a pseudo-symmetrical film stack 140 in FIG. 1 has the stack configuration of anisotropic film 142/isotropic film 144/anisotropic film 142 to achieve phase retardation. Thereby, the reflective phase retarder 1 has an advantageous effect of homogeneous phase retardation over broad frequency spectrum, where this effect is also called achromatic phase retardation.

A light beam of a first type polarization entering from a top surface 141 of the multi-layer structure 14, is converted by the multi-layer structure 14 into the light beam of a second type polarization, and is reflected by the reflective layer 12 leaving out of the top surface 141. In practical, as the light beam enters from air into the anisotropic dielectric film 142, the reflected light beam has a phase retardation of ½ wavelength over a visible wavelength range due to phase variation, caused by difference among three principal refractive indices of the anisotropic dielectric film 142, and that between the reflective layer 12 and the multi-layer structure 14. Moreover, the entering p-polarized (or s-polarized alternately) light beam can be reflected by the reflective phase retarder 1 to become the s-polarized (or p-polarized alternately) light beam.

In one embodiment, at least one anisotropic dielectric film 142 is constituted by an array of dielectric nanorods.

In one embodiment, both of the anisotropic dielectric film 142 and the isotropic dielectric film 144 are formed of $Ta_2O_5$.

Further, the reflective phase retarder 1 also includes at least one matching layer 16 as shown in FIG. 1. The matching layer 16 is formed on the multi-layer structure 14 to reduce reflectivity of the light beam entering the top surface 141 of the multi-layer structure 14.

Figure 2:
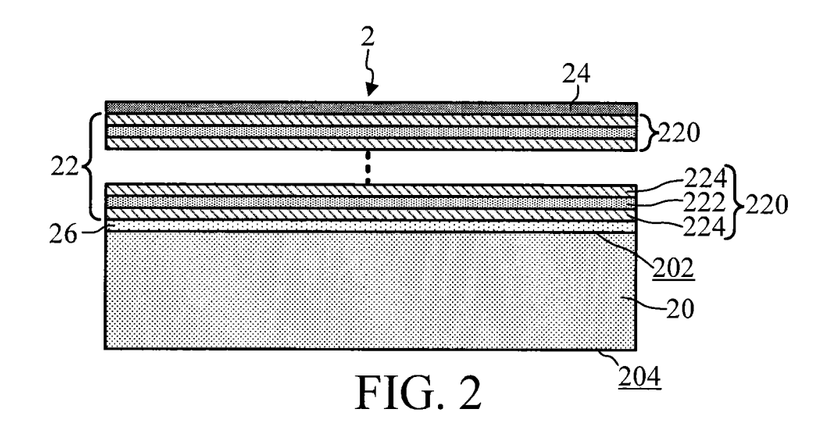
FIG. 2 is a cross sectional view of the reflective phase retarder according to the second preferred embodiment of the invention.

Referring to FIG. 2, FIG. 2 is a cross sectional view of the reflective phase retarder 2 according to the second preferred embodiment of the invention.

As shown in FIG. 2, the reflective phase retarder 2 includes a transparent substrate 20, a multi-layer structure 22 and a reflective layer 24. The multi-layer structure 22 is formed on a first surface 202 of the substrate 20. The multi-layer structure 22 is constituted by at least a symmetrical or a pseudo-symmetrical film stack 220. The symmetrical or a pseudo-symmetrical film stack 220 is the film stack such as ABA, ABCBA, ABCDCBA or other similar film stack, wherein A, B or C respectively denotes a single film within the stack. In particular, the symmetrical or a pseudo-symmetrical film stack 220 includes at least one anisotropic dielectric film. Taking a film stack of $(ABA)^m$ as an example, either or both of A-film and B-film may be an anisotropic dielectric film. The symmetrical or a pseudo-symmetrical film stack 220 in FIG. 2 has the configuration of anisotropic film 222/isotropic film 224/anisotropic film 222 to achieve phase retardation. Thereby, the reflective phase retarder 2 has an effect of homogeneous phase retardation over broad frequency spectrum.

A light beam of a first type polarization entering from a second surface 204 opposite to the first surface 202 of the transparent substrate 20, is converted by the multi-layer structure 22 into the light beam of a second type polarization, and is reflected by the reflective layer 24 leaving out of the second surface 204.

In one embodiment, at least one anisotropic dielectric film 222 is constituted by an array of dielectric nanorods.

In one embodiment, both of the anisotropic dielectric film 222 and the isotropic dielectric film 224 are formed of $Ta_2O_5$.

Further, the reflective phase retarder 2 also includes at least one matching layer 26 as shown in FIG. 2. The matching layer 26 is formed on the transparent substrate 20 to reduce reflectivity of the light beam entering the second surface 204 of the multi-layer structure 22.

Figure 3:
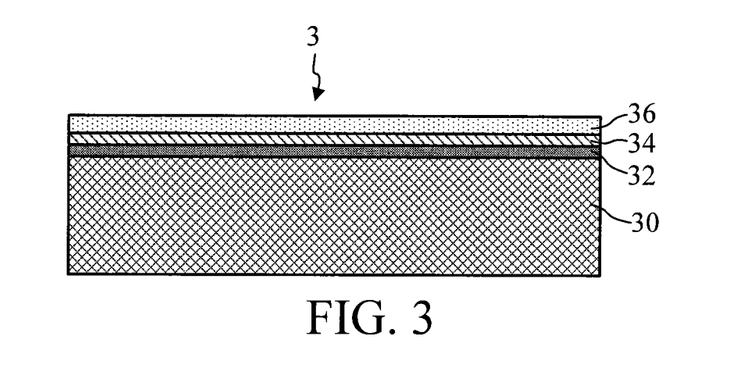
FIG. 3 is a cross sectional view of the reflective phase retarder according to the third preferred embodiment of the invention.

Referring to FIG. 3, FIG. 3 is a cross sectional view of the reflective phase retarder 3 according to the third preferred embodiment of the invention.

As shown in FIG. 3, the reflective phase retarder 3 includes a substrate 30, a reflective layer 32 and an anisotropic dielectric film 34. The reflective layer 32 is formed on the substrate 30. The anisotropic dielectric film 34 is formed on the reflective layer 32, and is constituted by an array of dielectric nanorods. Therein, a light beam of a first type polarization, entering the anisotropic dielectric film 34, is converted by the anisotropic dielectric film 34 into the light beam of a second type polarization, and is reflected by the reflective layer 32 leaving out of the anisotropic dielectric film 34.

In one embodiment, the anisotropic dielectric film 34 is formed of $Ta_2O_5$.

Further, the reflective phase retarder 3 also includes at least one matching layer 36 as shown in FIG. 3. The matching layer 36 is formed on the anisotropic dielectric film 34 to reduce reflectivity of the light beam entering the surface of the anisotropic dielectric film 34.

Figure 4:
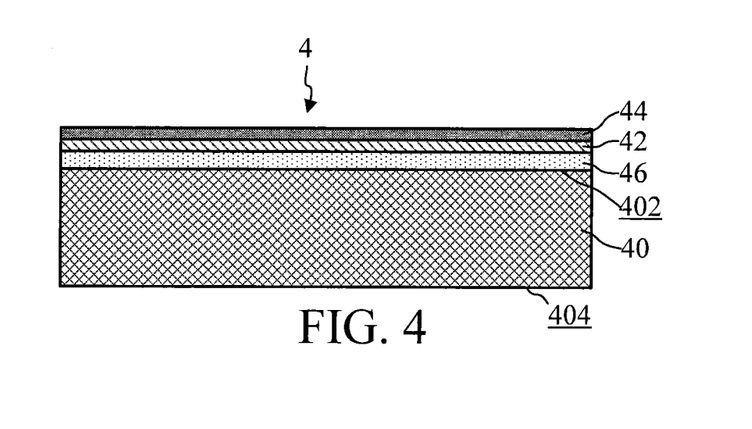
FIG. 4 is a cross sectional view of the reflective phase retarder according to the fourth preferred embodiment of the invention.

Referring to FIG. 4, FIG. 4 is a cross sectional view of the reflective phase retarder 4 according to the fourth preferred embodiment of the invention.

As shown in FIG. 4, the reflective phase retarder 3 includes a transparent substrate 40, an anisotropic dielectric film 44 and a reflective layer 42. The anisotropic dielectric film 44 is formed on a first surface 402 of the transparent substrate 40, and is constituted by an array of dielectric nanorods. The reflective layer 44 is formed on the anisotropic dielectric film 42. Therein, a light beam of a first type polarization, entering a second surface 404 opposite to the first surface 402, is converted by the anisotropic dielectric film 44 into the light beam of a second type polarization, and is reflected by the reflective layer 42 leaving out of the second surface 404.

In one embodiment, the anisotropic dielectric film 42 is formed of $Ta_2O_5$.

Further, the reflective phase retarder 4 also includes at least one matching layer 46 as shown in FIG. 4. The matching layer 46 is formed between the transparent substrate 40 and the anisotropic dielectric film 44 to reduce reflectivity of the light beam entering the surface of the anisotropic dielectric film 44.

The example A of the reflective phase retarder 3 would be described in detail in the following paragraph along with its structure shown in FIG. 5. Referring to FIG. 6, FIG. 6 is an SEM image of cross sectional view of example A of the reflective phase retarder 3 showing the micro structure and thickness of the anisotropic dielectric film 34.

First, a glass substrate 30 of BK7 material is prepared. Then, an isotropic film of metal (e.g., Ag) of about a thickness of about 200 nm is vapor deposited on the glass substrate 30 to serve as a reflective layer 32. Next, the oblique deposition of $Ta_2O_5$ is performed to obtain such an anisotropic dielectric film 34 that an included angle between the principal axis of the anisotropic film 34 and the normal line of the glass substrate 30 is about $\beta=34$ degrees shown in FIG. 5. The resulting structure can serve as a single-layer obliquely deposited reflective phase retarder 3. Three principal refractive indices of the anisotropic dielectric film 34 respectively are 1.765, 1.653 and 1.751. The thickness of the anisotropic dielectric film 34 is about 1600 nm. Finally, a matching layer 36 is vapor deposited on the anisotropic dielectric film 34.

Figure 5:
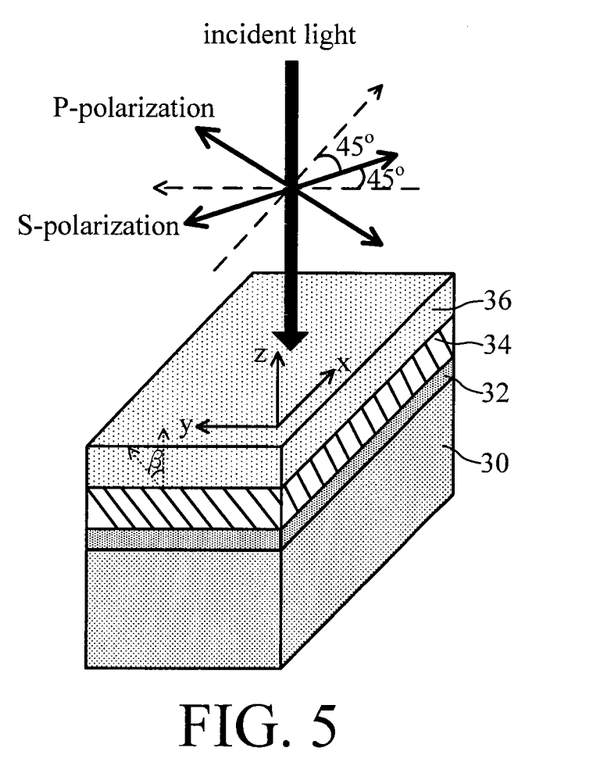
FIG. 5 schematically illustrates the structure of example A of the reflective phase retarder of the invention.
Figure 6:
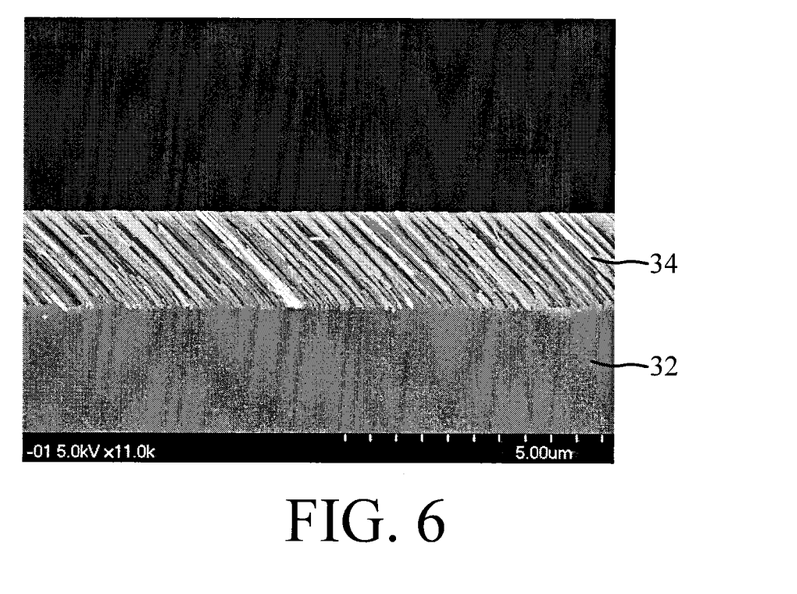
FIG. 6 is an SEM image of cross sectional view of example A of the reflective phase retarder of the invention.

As the s-polarized light beam, e.g., the s-polarized incident light beam, shown in FIG. 5, proceeds through the isotropic dielectric of refractive index of 1.6 to the reflective phase retarder 3 vertically, the electrical field of the s-polarized incident light beam is split into two eigen-waves of similar amplitude. After passing through the anisotropic dielectric film 34 and being reflected by the reflective layer 32, the phase difference of two eigen-waves determines the phase retardations $\Delta$ of the reflected s-polarized light beam and the p-polarized light beam.

Figure 7:
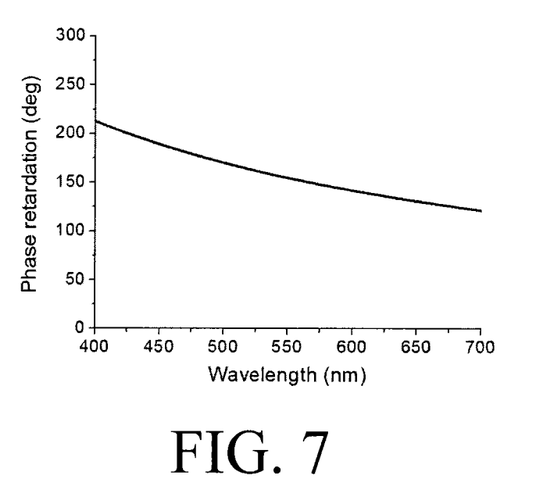
FIG. 7 shows measured phase retardation of example A of the reflective phase retarder of the invention over a visible wavelength range.

As shown in FIG. 7, the measured phase retardation $\Delta$ of example A of the reflective phase retarder 3 over a visible wavelength range (400 nm~700 nm) is 180±45.5 degrees. Moreover, it is also found that, with the incident light angles of from 0 to 40 degrees, over 80% of the s-polarized light beam is converted to p-polarized light beam. Therefore, example A of the reflective phase retarder 3 can be served as a polarization converter of high performance.

Example B of the reflective phase retarder 1 is described in the following paragraph. In order to implement an achromatic wave plate over a visible wavelength range, similarly, a glass substrate 10 of BK7 material is prepared. Then, an isotropic film of metal (e.g., Ag) having thickness of about 200 nm is vapor deposited on the glass substrate 10 to serve as a reflective layer 12. Next, an anisotropic $Ta_2O_5$ film 142 is formed having oblique rod crystals of $Ta_2O_5$. Then, an isotropic film 144 of $Ta_2O_5$ is vapor deposited to constitute at least a symmetrical or a pseudo-symmetrical film stack 140 which has odd number of symmetrical film stacks shown in FIG. 1. Next, the film stack 140 is repeatedly stacked to form the structure as shown in FIG. 1.

Figure 8:
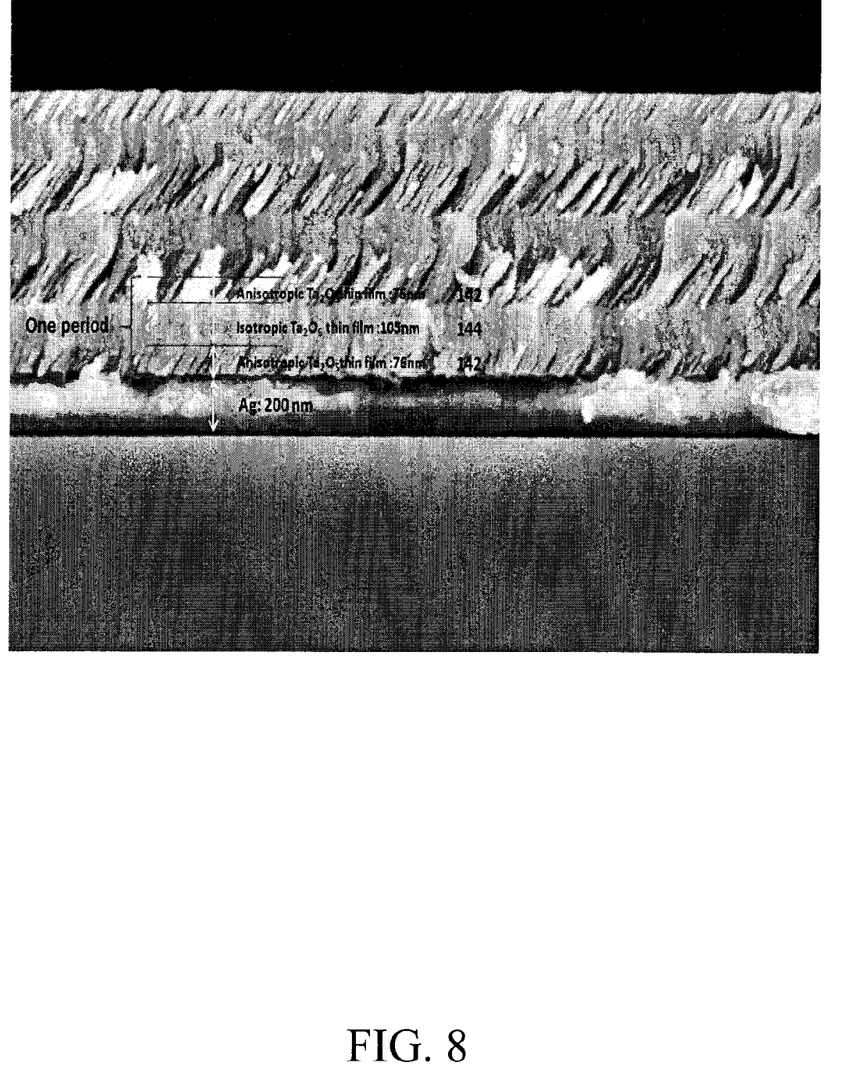
FIG. 8 is an SEM image of cross section view of example B of the reflective phase retarder of the invention.

Referring to FIG. 8, FIG. 8 is an SEM image of cross sectional view of example B of the reflective phase retarder 1 showing the micro structure of several periods of stack which has configuration of (anisotropic dielectric film 142/isotropic $Ta_2O_5$ film 144/anisotropic dielectric film 142) on Ag layer having thickness of about 200 nm. The plenary refractive indices of the anisotropic $Ta_2O_5$ film 142 for X polarized light beam and Y polarized light beam respectively are $n_x=1.311$ and $n_y=1.405$, respectively. The thickness of the anisotropic $Ta_2O_5$ film 142 is 76 nm. The refractive index of the isotropic $Ta_2O_5$ film 144 is 2.2. The thickness of the isotropic $Ta_2O_5$ film 144 is 105 nm. A matching layer is introduced between air and the film stack 140 (anisotropic $Ta_2O_5$ film/isotropic $Ta_2O_5$ film/anisotropic $Ta_2O_5$ film) of 8 periods to reduce reflectivity and variation of phase retardation over wavelength. The matching layer is constituted by three isotropic films (RSR) where film R is formed of $MgF_2$ and has thickness of 80 nm, and film S is formed of $ZrO_2$ and has thickness of 110 nm. When the incident light beam is s-polarized light beam, the electrical field of the s-polarized incident light beam is split into two eigen-waves with similar amplitude. After passing through the periodic multi-layered structure 14 and being reflected by the reflective layer 12, the phase difference between the two eigen-waves determines phase retardations $\Delta$ of the reflected s-polarized and the p-polarized components. With design of the periodic multi-layered structure 14, the phase retardation does not vary intensively with wavelength change.

Figure 9:
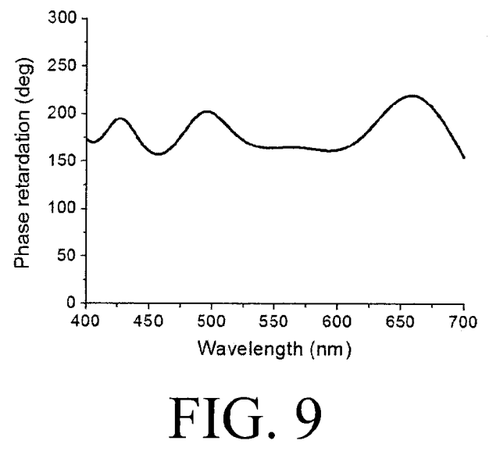
FIG. 9 shows measured phase retardation of example B of the reflective phase retarder of the invention over a visible wavelength range.

As shown in FIG. 9, the measured phase retardation $\Delta$ of example B of the reflective phase retarder 1 over a visible wavelength range (400 nm~700 nm) is 180±23.4 degrees. Moreover, it is found that with the incident light angles of from 0 to 15 degrees, over 90% of the s-polarized light beam is converted to p-polarized light beam. Therefore, example B of the reflective phase retarder 1 can be served as a polarization converter with high performance.

Figure 10:
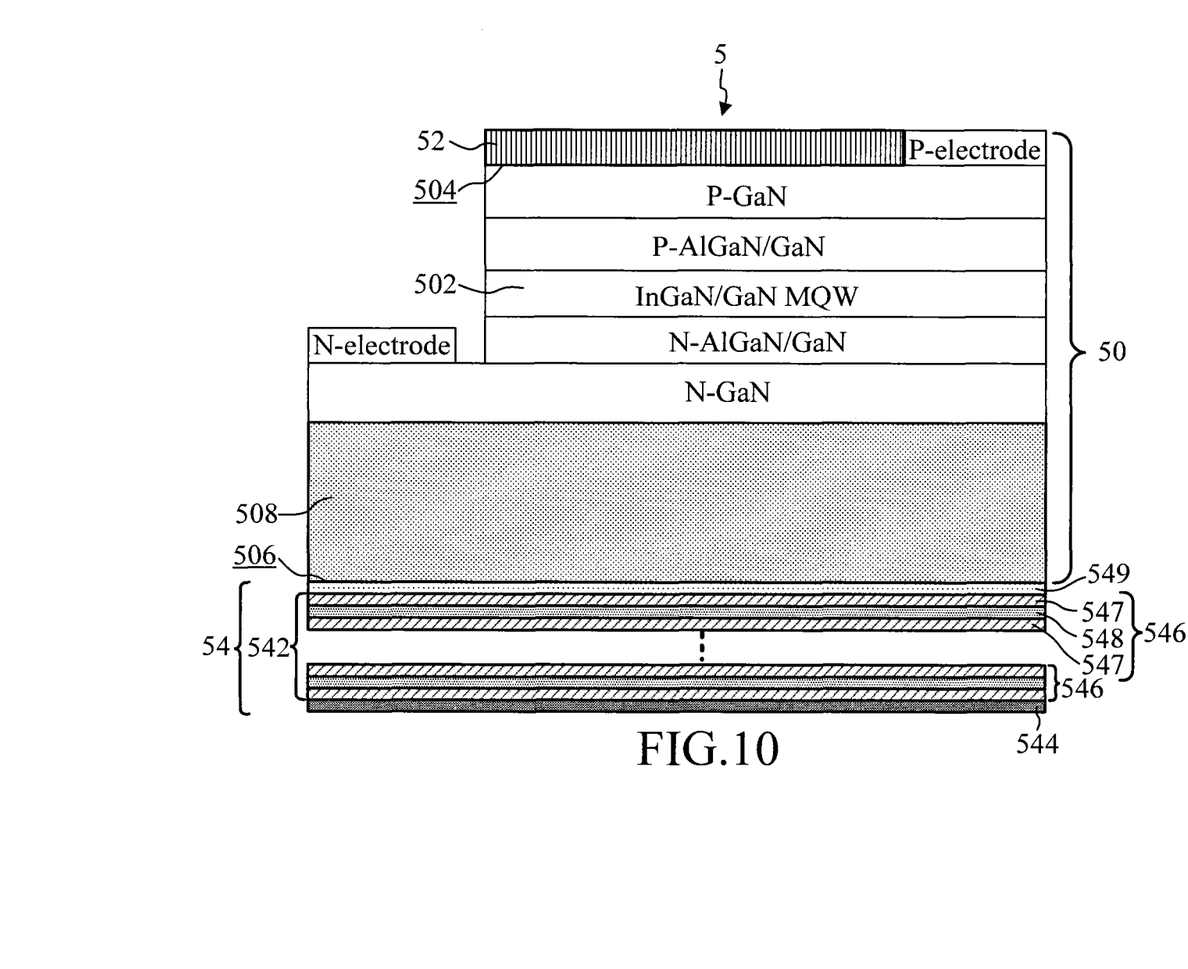
FIG. 10 is a cross sectional view of the semiconductor light-emitting device according to a preferred embodiment of the invention.

Referring to FIG. 10, FIG. 10 is a cross sectional view of the semiconductor light-emitting device 5 according to a preferred embodiment of the invention.

As shown in FIG. 10, the semiconductor light-emitting device 5 of the invention implemented as a light-emitting diode includes a semiconductor multi-layer structure 50, a polarizing beam splitter 52 and a reflective phase retarder 54. The semiconductor multi-layer structure 50 includes a light-emitting layer 502 capable of being driven by an electric current to emit a first light beam of a first type polarization (such as p-polarized light beam) and a second light beam of a second type polarization (such as s-polarized light beam).

The polarizing beam splitter 52 is formed on a top surface 504 of the semiconductor multi-layer structure 50, and is for transmitting the first light beam of the first type polarization (such as p-polarized light beam), and for reflecting the second light beam of the second type polarization (such as s-polarized light beam). The reflective phase retarder 54 is formed on a bottom surface 506 of the semiconductor multi-layer structure 50. As shown in FIG. 10, the semiconductor multi-layer structure 50 also includes a semiconductor substrate 508. The semiconductor substrate 508 provides a bottom surface 506.

The reflected second light of the second type polarization (such as s-polarized light beam) by the polarizing beam splitter 52 entering the reflective retarder 54, is converted into the light beam of the first type polarization, and is reflected again to transmit through the polarizing beam splitter 52. Thereby, the polarization performance of the semiconductor light-emitting device 5 can be enhanced significantly.

In one embodiment, the reflective phase retarder 54 includes a multi-layer structure 542 and a reflective layer 544. The multi-layer structure 542 is formed on the bottom surface 506 of the semiconductor multi-layer structure 50, and is constituted by at least a symmetrical or a pseudo-symmetrical film stack 546 shown in FIG. 10. The structure and efficiency of the film stack 546 have been described in details above with respect to FIG. 1 and FIG. 2, and will not be described herein in details. In particular, the film stack 546 includes at least one anisotropic dielectric film. Taking film stacks of $(ABA)^m$ as an example of the film 546, either or both of A-film and B-film may be an anisotropic dielectric film, wherein m is the number of repetition of film stack. The film stack 546 in FIG. 10 has the configuration of anisotropic film 547/isotropic film 548/anisotropic film 547 to cause the expected phase retardation. The reflective layer 544 is formed on the multi-layer structure 542.

In one embodiment, at least one anisotropic dielectric film 547 is constituted by an array of dielectric nanorods.

In one embodiment, both of the anisotropic dielectric film 547 and the isotropic dielectric film 548 are formed of $Ta_2O_5$.

Further, the reflective phase retarder 54 also includes at least one matching layer 549, as shown in FIG. 10. The matching layer 549 is formed between the multi-layer structure 542 and the semiconductor multi-layer structure 50 to reduce reflectivity of the light beam entering the multi-layer structure 542.

In one embodiment, the polarizing beam splitter 52 is constituted by a plurality of parallel metal wires with pitch of about 100 nm for functioning as a sub-wavelength grating. In an example, aluminum is used to make periodical metal wires and the cross section of each aluminum wire is a rectangle of thickness d being equals to about 40 nm and height h being equals to about 150 nm. If an incident light beam has electric field parallel to the structure of metal wires, it is found that for p-polarized light beam, the transmittance of the incident light beam in average equals about 0.4%, and the reflectivity of the incident light beam in average equals about 73.3% over a visible wavelength range (400 nm~700 nm). If an incident light beam (e.g., an s-polarized light beam) has electric field perpendicular to the structure of metal wires, it is found that for s-polarized light beam, the transmittance of the incident light beam in average equals about 84.7%, and the reflectivity of the incident light beam in average equals about 3.1% over a visible wavelength range (400 nm~700 nm). Using aforesaid properties, the structure of metal wires can achieve the desired function of polarized beam splitter.

In another embodiment, the polarizing beam splitter 52 has a structure of multiple layers of anisotropic dielectric film. Due to inherent birefringence, the anisotropic dielectric film provides different refractive indices for light beams of different polarizations. Using aforesaid properties, the structure of multiple layers of anisotropic dielectric film can function as the polarizing beam splitter. In an example, $ZrO_2$ is selected to deposit different films of film X and film Y respectively. With respect to s-polarized light beam, one set of ($n_{SX}$=1.667, $n_{SY}$=1.583) represents refractive indices of film X and film Y. With respect to p-polarized light beam, one set of ($n_{PX}$=1.624, $n_{PY}$=1.624) represents refractive indices of film X and film Y. Film X and film Y are repeatedly and alternately stacked to implement multiple layers of anisotropic dielectric films.

As to a stack of quarter-wave films functioning in reflecting s-polarized light beam and transmitting p-polarized light beam at a wavelength of 550 nm, the structure of multiple anisotropic dielectric films with 30 periods of film X and film Y alternately stacked can practice to the effect of the transmittance of the s-polarized light beam being equals about 91% and the reflectivity of the p-polarized light beam being equals 97%.

In still another embodiment, the polarizing beam splitter 52 includes a transparent grating layer, a plurality of low refractive index films and a plurality of high refractive index films. The transparent grating layer is formed on the top surface 504 of the semiconductor multi-layer structure 50, and thereon has a plurality of parallel protruding strings. A constant pitch exists between the adjacent protruding strings. The low refractive index films and the high refractive index films are alternately formed on the transparent grating layer.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:
1. A semiconductor light-emitting device, comprising:
   a semiconductor multi-layer structure, comprising a light-emitting layer being driven by an electric current to emit a first light beam of a first type polarization and a second light beam of a second type polarization;
   a polarizing beam splitter, formed on a top surface of the semiconductor multi-layer structure, for transmitting the first light beam, and reflecting the second light beam; and
   a reflective phase retarder, formed on a bottom surface of the semiconductor multi-layer structure, for inputting and con- verting the reflected second light into a third light beam of the first type polarization impinging to pass through the polarizing beam splitter.

2. The semiconductor light-emitting device of claim 1, wherein the reflective phase retarder comprises:
   a multi-layer structure, formed on the bottom surface of the semiconductor multi-layer structure and being constituted by at least a symmetrical or a pseudo-symmetrical film stack, at least a symmetrical or a pseudo-symmetrical film stack including at least one anisotropic dielectric film; and
   a reflective layer, formed on the multi-layer structure.

3. The semiconductor light-emitting device of claim 2, wherein the at least one anisotropic dielectric film is constituted by an array of dielectric nanorods.

4. The semiconductor light-emitting device of claim 2, further comprising at least one matching layer which is formed between the semiconductor multi-layer structure and the multi-layer structure to reduce reflectivity of the reflected second light beam entering the surface of the multi-layer structure.

5. The semiconductor light-emitting device of claim 2, wherein the polarizing beam splitter is constituted by a plurality of parallel sub-wavelength metal wires, and a constant pitch exists between two adjacent sub-wavelength metal wires.

6. The semiconductor light-emitting device of claim 2, wherein the polarizing beam splitter is a structure of multiple anisotropic dielectric films.

7. The semiconductor light-emitting device of claim 2, wherein the polarizing beam splitter comprises:

a transparent grating layer, formed on the top surface of the semiconductor multi-layer structure and thereon having a plurality of parallel protruding strings, a constant pitch existing between two adjacent protruding strings; and a plurality of low refractive index films and a plurality of high refractive index films, alternately formed on the transparent grating layer.

* * * * *